(12) United States Patent
Nikmanesh

(10) Patent No.: US 6,411,521 B1
(45) Date of Patent: Jun. 25, 2002

(54) APPARATUS FOR GROUNDING AND SECURING PRINTED CIRCUIT BOARDS IN A CARRIER

(75) Inventor: Khalil N. Nikmanesh, Broomfield, CO (US)

(73) Assignee: Avaya Inc., Basking Ridge, NJ (US)

( * ) Notice: Subject to any disclaimer, the term of this patent is extended or adjusted under 35 U.S.C. 154(b) by 0 days.

(21) Appl. No.: 09/649,369

(22) Filed: Aug. 28, 2000

(51) Int. Cl.[7] .............................. H05K 1/14; H05K 7/00
(52) U.S. Cl. ..................... 361/799; 361/752; 361/759; 361/801; 174/51; 439/108
(58) Field of Search ................... 361/759, 799, 361/800, 801, 802, 816, 818, 825, 752; 174/35 R, 51, 138 G; 439/108, 368, 374

(56) References Cited

U.S. PATENT DOCUMENTS

| | | | | |
|---|---|---|---|---|
| 4,503,484 A | * | 3/1985 | Moxon | 361/801 |
| 4,964,810 A | * | 10/1990 | Malotke et al. | 361/736 |
| 5,390,083 A | * | 2/1995 | Decker et al. | 361/796 |
| 5,477,420 A | * | 12/1995 | Brooks | 361/796 |
| 5,698,821 A | * | 12/1997 | Herman | 174/72 R |
| 5,708,552 A | * | 1/1998 | Han et al. | 361/799 |
| 5,822,193 A | * | 10/1998 | Summers et al. | 361/759 |

* cited by examiner

Primary Examiner—Jayprakash N. Gandhi
(74) Attorney, Agent, or Firm—John C. Moran

(57) ABSTRACT

Allowing printed circuit boards to be secured in a printed circuit carrier by means of a retaining bar that is secured at its ends to the printed circuit board carrier. Contact is established between the retaining bar and each individual printed circuit board by depositing a copper area on the back face of the printed circuit board and making contact with this area by the retaining bar. The conductive area is connected to the ground of the printed circuit board, and the retaining bar is conductive in nature and makes contact at either end with the printed circuit board carrier. The retaining bar is designed to provide vertical strength throughout its length.

4 Claims, 2 Drawing Sheets

FRONT VIEW

APPARATUS FOR GROUNDING AND SECURING PRINTED CIRCUIT BOARDS IN A CARRIER

TECHNICAL FIELD

This invention relates generally to mounting printed circuit boards in printed circuit carriers and relates specifically to the securing and grounding of the printed circuit boards in the printed circuit carrier.

BACKGROUND OF THE INVENTION

Within telecommunication switching systems and other systems, it is known to mount printed circuit boards in printed circuit carriers to interconnect the printed circuit boards for the communication of signals and supply power to the printed circuit boards. Within the prior art, the printed circuit boards are secured into the carriers by latches mounted on each individual printed circuit board. When the latch is in the locked position, the printed circuit board is physically secured and grounded to the printed circuit board cabinet. It is necessary to ground the printed circuit boards to the carrier so as to prevent electrical static discharges between the carrier and the printed circuit board. The latches on the printed circuit boards function well for their intended purpose; however, the cost of manufacturing the latches and assembling the latches onto the printed circuit board is high. In addition, the latches on occasion break, and the printed circuit board must be sent back for repair of the broken latch.

SUMMARY OF THE INVENTION

The proceeding problem is solved and a technical advance is achieved by an apparatus that allows printed circuit boards to be secured in a printed circuit carrier by means of a retaining bar that is secured at its ends to the printed circuit board carrier. Contact is established between the retaining bar and each individual printed circuit board by depositing a copper area on the back face of the printed circuit board and making contact with this area by the retaining bar. Advantageously, the conductive area is connected to the ground of the printed circuit board, and the retaining bar is conductive in nature and makes contact at either end with the printed circuit board carrier. Advantageously, the retaining bar is designed to provide vertical strength throughout its length.

These and other features and advantages of the invention will become more apparent from the following description of an illustrative embodiment of the invention considered together with the drawing.

DETAILED DESCRIPTION

Figure 1:
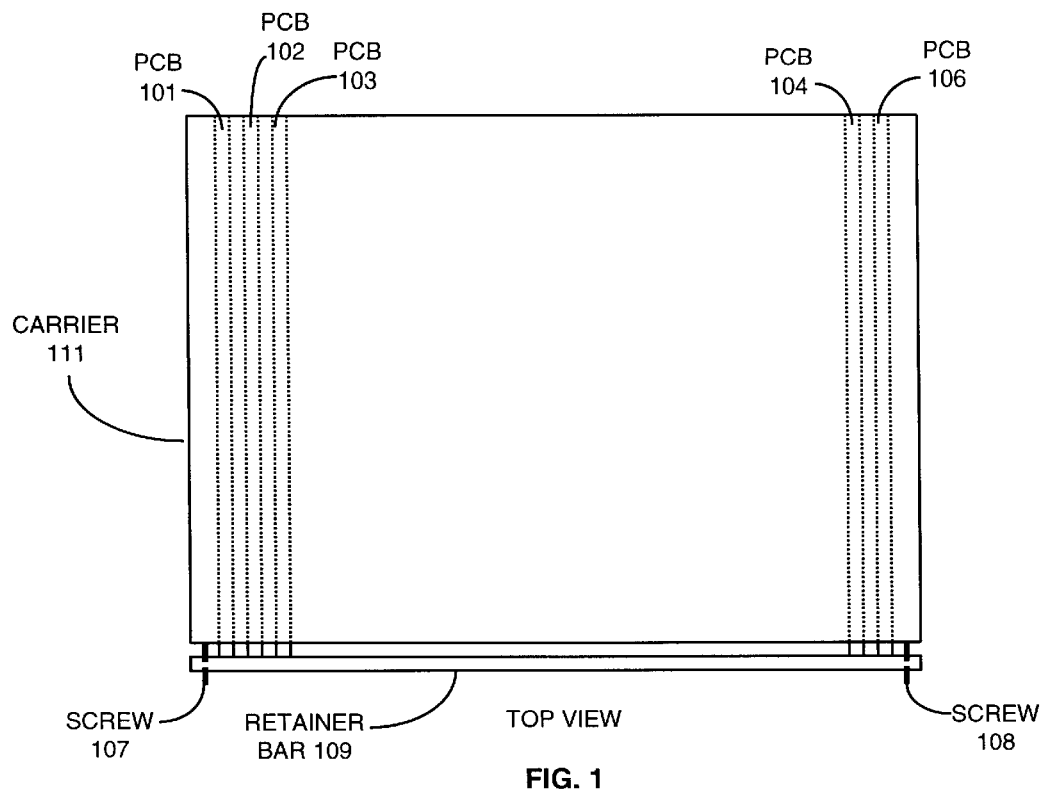
FIGS. 1–3 illustrate top, front and side views of the embodiment of the invention.
Figure 3:
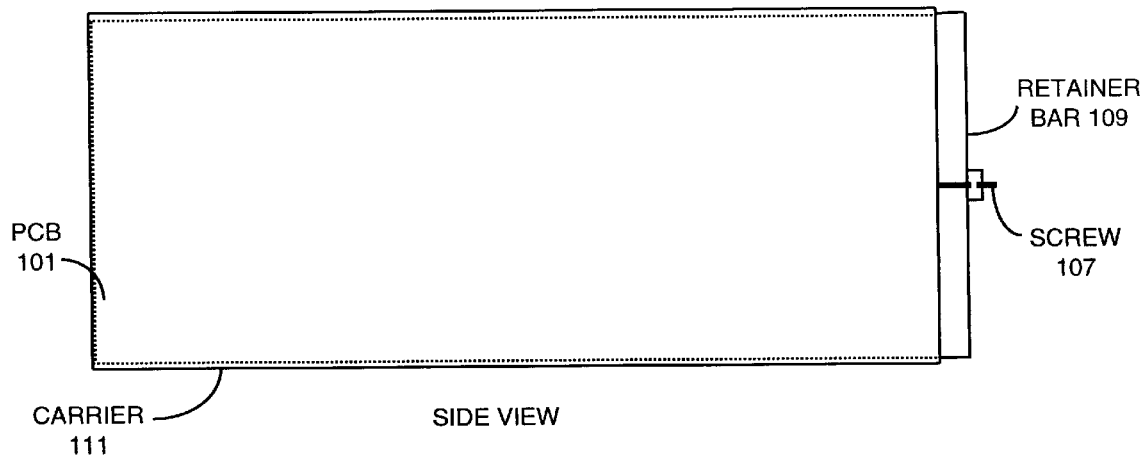

FIG. 1 illustrates a top view of an embodiment of the invention. Printed circuit boards (PCB) 101–106 are inserted into carrier 111. Not illustrated in FIG. 1 are the connectors that would be on the front of the PCBs to make electrical contact with the backplane of carrier 111. Such connectors and backplanes are well known to those skilled in the art. PCBs 101–106 are secured in position by retainer bar 109 that is attached to carrier 111 at either end by-screws 107 and 108. As illustrated in FIG. 3, retaining bar 109 is an elongated cube so as to supply strength in order to maintain a pressure on the back of PCBs 101–106. One skilled in the art could readily envision that rather than being an elongated cube, retaining bar 109 could be solid or be U-shaped.

Figure 2:
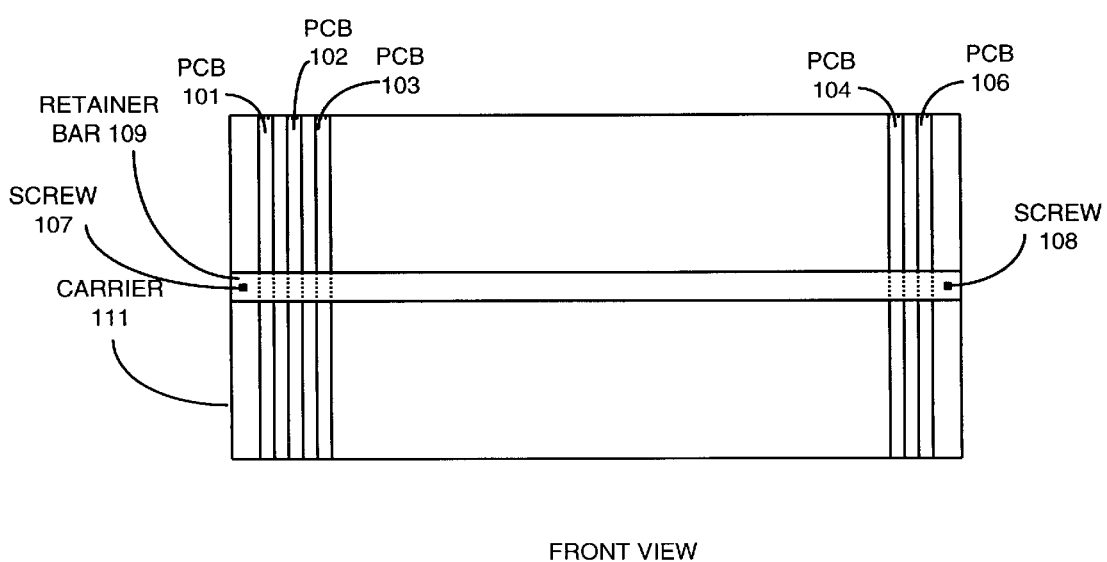

FIGS. 1 and 2 illustrate the utilization of screws 107 and 108 to secure retaining bar 109 to carrier 111. Those skilled in the art could readily envision the utilization of other securing mechanisms in place of screws 107 and 108. Retaining bar 109 is conductive as is carrier 111 and screws 107 and 108.

Figure 4:
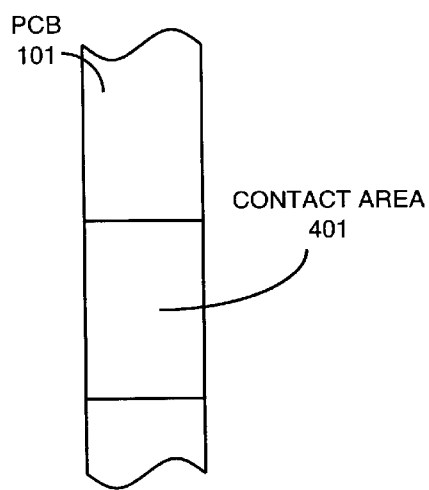
FIG. 4 illustrates in greater detail the contact area on a printed circuit board.

As illustrated in FIG. 4, each printed circuit board has a contact area 401 which is an area on the back of the card connected to the grounding system of the printed circuit board. Contact area 401 is formed during the fabrication of the printed circuit board by depositing copper on the back face of the printed circuit board using techniques that are well known in the art. Retaining bar 109 makes contact with each of the contacts area 401 on each individual printed circuit board 101–106. From FIGS. 1–4 it is clear that retaining bar 109 physically secures and grounds PCBs 101–106 in and to carrier 111.

It is to be understood that the above-described embodiment is merely illustrative of the principles of the invention and that other arrangements may be devised by those skilled in the art without departing from the spirit or the scope of the invention.

What is claimed is:

1. An electronic packaging assembly, comprising:
    a printed circuit carrier having a backplane;
    a plurality of printed circuit boards insert into the printed circuit carrier and the plurality of printed circuit boards communicating signals via the backplane;
    outer surface of the printed circuit carrier conducting electricity;
    each of the plurality of printed circuit boards having on a back face of each of the plurality of printed circuit boards a deposited conductive area and a the conductive area is connected to a ground of each of the plurality of printed circuit boards and the conductive area of each of the plurality of printed circuit boards extending out of back of the printed circuit carrier while the each of the plurality of printed circuit boards is inserted into the printed circuit carrier; and
    a retainer bar being a conductor of electricity and positioned across the back of the printed circuit carrier so as to make contact with each of the conductive areas of each of the plurality of printed circuit boards and secured at ends of the retainer bar to the printed circuit carrier and making electrical contact with the printed circuit carrier via the ends of the retainer bar whereby the plurality of printed circuit boards are secured in the printed circuit carrier and are electrically grounded to the outer surface of the printed circuit carrier.

2. The electronic packaging assembly of claim 1 wherein the ends of the retainer bar are secured to the printed circuit carrier by screws that attach through the retainer bar into the outer surface of the printed circuit carrier.

3. The electronic packaging assembly of claim 2 wherein electrical contact between the retainer bar and the outer surface of the printed circuit carrier is established via the screws making contact with the retainer bar and the printed circuit carrier.

4. The electronic packaging assembly of claim 3 wherein the retainer bar is and elongated cube in shape.

* * * * *